United States Patent
Emira et al.

(10) Patent No.: US 12,057,845 B2
(45) Date of Patent: Aug. 6, 2024

(54) FRACTIONAL DIVIDER-CALIBRATED PHASE MODULATOR AND INTERPOLATOR FOR A WIRELESS TRANSMITTER

(71) Applicant: Shenzhen Goodix Technology Co., Ltd., Shenzhen (CN)

(72) Inventors: Ahmed Emira, San Diego, CA (US); Mohamed Yehya Abbas Abdelgawad Nada, San Diego, CA (US); Faisal Hussien, San Diego, CA (US); Mohamed Aboudina, San Diego, CA (US); Esmail Babakrpur Nalousi, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/878,077

(22) Filed: Aug. 1, 2022

(65) Prior Publication Data

US 2024/0039521 A1     Feb. 1, 2024

(51) Int. Cl.
*H03K 5/15*      (2006.01)
*G06F 1/08*      (2006.01)
(Continued)

(52) U.S. Cl.
CPC ........... *H03K 5/15013* (2013.01); *G06F 1/08* (2013.01); *G06F 1/10* (2013.01); *H03K 3/037* (2013.01);
(Continued)

(58) Field of Classification Search
CPC .... H03K 5/15013; H03K 3/037; H03K 5/159; H03K 2005/00078; H03K 2005/00286; G06F 1/08; G06F 1/10
See application file for complete search history.

(56) References Cited

U.S. PATENT DOCUMENTS 4,618,788 A * 10/1986 Backes ................... H03K 5/131
                                                     327/277
6,477,186 B1 * 11/2002 Nakura ................... H04J 3/047
                                                     370/537
(Continued)

FOREIGN PATENT DOCUMENTS

JP            4783216 B2 *    9/2011

*Primary Examiner* — Metasebia T Retebo
*Assistant Examiner* — James G Yeaman
(74) *Attorney, Agent, or Firm* — Kilpatrick Townsend & Stockton LLP (57) ABSTRACT

Techniques are described herein for phase modulation and interpolation that support high phase modulation resolution with high linearity. Embodiments receive a digital signal that uses a sequence of K-bit digital codes to encode a sequence of instantaneous phases for phase-modulating a local oscillator signal. A fractional divider divides a reference clock into N divided clock signals at equally spaced phase intervals and selects a pair of such signals based on first designated bits of the digital code. A fractional divider-calibrated delay line generates M delayed clock signals at equally spaced phase intervals between the selected pair of divided clock signals, and selects a pair of the delayed clock signals based on second designated bits of the digital code. A digital controlled edge interpolator generates a delayed local oscillator output signal by interpolating between the selected pair of delayed clock signals based on third designated bits of the digital code.

20 Claims, 8 Drawing Sheets

(51) Int. Cl.
  *G06F 1/10*    (2006.01)
  *H03K 3/037*   (2006.01)
  *H03K 5/00*    (2006.01)
  *H03K 5/159*   (2006.01)

(52) U.S. Cl.
  CPC ... *H03K 5/159* (2013.01); *H03K 2005/00078* (2013.01); *H03K 2005/00286* (2013.01)

(56) References Cited

U.S. PATENT DOCUMENTS

| | | | |
|---|---|---|---|
| 8,674,773 B2 * | 3/2014 | Nedovic | H03L 7/0995 327/159 |
| 2007/0018707 A1 * | 1/2007 | Rajagopal | H03K 5/13 327/231 |
| 2012/0092051 A1 * | 4/2012 | Erdogan | H03L 7/0814 327/158 |
| 2016/0336954 A1 * | 11/2016 | Tsai | H03M 1/08 |
| 2022/0224318 A1 * | 7/2022 | Son | G06F 1/12 |

* cited by examiner

FIG. 8

FRACTIONAL DIVIDER-CALIBRATED PHASE MODULATOR AND INTERPOLATOR FOR A WIRELESS TRANSMITTER

FIELD

Embodiments described herein are generally concerned with wireless transmitters, and, more particularly, with phase modulation and interpolation in wireless transmitters.

BACKGROUND

Many types of wireless communications, such as Bluetooth® low energy (BLE) and others, use phase modulation to encode a data stream. A sequence of data bits can be converted to a sequence of instantaneous phases, a local oscillator can be modulated according to the sequence of instantaneous phases, the phase-modulated local oscillator signal can be used to modulate a power amplifier output in a voltage-controlled oscillator (VCO), and the modulated power amplifier output can modulate the output frequency of the VCO. In some such transmitters, a digital system converts the sequence of instantaneous phases into a sequence of digital codes, and a digital-to-time converter converts the sequence of digital codes into the phase-modulated local oscillator signal. Conventionally, such transmitters tend to have several limitations. For example, the digital-to-time converter may support only a limited resolution of phase information within acceptable levels of linearity and/or other design parameters. The limited phase-resolution can tend to limit the transmission bandwidth supported by the transmitter, which can also tend to limit the transmission modes supported by the transmitter.

BRIEF SUMMARY OF THE INVENTION

Embodiments include systems and methods for phase modulation and interpolation in a wireless transmitter to support high phase modulation resolution with high linearity. Embodiments receive a digital signal that uses a sequence of K-bit digital codes to encode a sequence of instantaneous phases for phase-modulating a local oscillator signal. A fractional divider divides a reference clock into N divided clock signals at equally spaced phase intervals and selects a pair of such signals based on first designated bits of the digital code. A fractional divider-calibrated delay line generates M delayed clock signals at equally spaced phase intervals between the selected pair of divided clock signals, and selects a pair of the delayed clock signals based on second designated bits of the digital code. A digital controlled edge interpolator generates a delayed local oscillator output signal by interpolating between the selected pair of delayed clock signals based on third designated bits of the digital code.

According to a first set of embodiments, a phase modulation and interpolation system is provided for a wireless transmitter. The system includes: a fractional divider, a fractional delay-calibrated (FDC) delay line, and a digital controlled edge interpolator (DCEI). The fractional divider is to divide a local clock signal to generate N divided clock signals and to output first and second divided clock signals of the N divided clock signals selected based on a digital signal that encodes instantaneous phase for phase-modulating a signal for transmission. The instantaneous phase is greater than or equal to a first phase of the first divided clock signal and less than or equal to a second phase of the second divided clock signal, and the first and second phases are separated by 360/N degrees. The FDC delay line is coupled with the fractional divider to generate M delayed clock signals using M stages of a voltage-controlled delay line that are calibrated based on the first and second divided clock signals and to output first and second delayed clock signals of the M delayed clock signals selected based on the digital signal. The instantaneous phase is greater than or equal to a third phase of the first delayed clock signal and less than or equal to a fourth phase of the second delayed clock signal, and the third and fourth phases are separated by 360/(N*M) degrees. The DCEI is coupled with the FDC delay line to generate an interpolated clock signal to have the instantaneous phase based on weighting an average of the third and fourth phases according to the digital signal and to output the interpolated clock signal. Some such embodiments further include an output interface to couple the DCEI with a power amplifier of a voltage-controlled oscillator, such that a voltage output by the power amplifier is modulated according to the interpolated clock signal.

According to another set of embodiments, a method is provided for phase modulation and interpolation in a wireless transmitter. The method includes: receiving a digital signal that encodes an instantaneous phase for phase-modulating a signal for transmission; dividing a local clock signal by a fractional divider to generate N divided clock signals; selecting first and second divided clock signals of the N divided clock signals based on the digital signal, the instantaneous phase being greater than or equal to a first phase of the first divided clock signal and less than or equal to a second phase of the second divided clock signal, the first and second phases being separated by 360/N degrees; generating M delayed clock signals by calibrating M stages of a voltage-controlled delay line based on the first and second divided clock signals; selecting first and second delayed clock signals of the M delayed clock signals based on the digital signal, the instantaneous phase being greater than or equal to a third phase of the first delayed clock signal and less than or equal to a fourth phase of the second delayed clock signal, the third and fourth phases being separated by 360/(N*M) degrees; and generating an interpolated clock signal to have the instantaneous phase based on weighting an average of the third and fourth phases according to the digital signal. Some such embodiments further include modulating a power amplifier output of a voltage-controlled oscillator according to the interpolated clock signal.

BRIEF DESCRIPTION OF THE DRAWINGS

The benefits and advantages of the invention concept will be apparent from the detailed description of embodiments of the present disclosure and the accompanying drawings in which like reference characters and numerals refer to the same parts throughout the figures. The drawings are not to scale, and emphasis is placed upon illustrating the principles of the inventive concept.

DETAILED DESCRIPTION OF THE INVENTION

Many wireless transmitters rely on voltage-controlled oscillators (VCOs) to control and modulate the output frequency of the transmitter. Some VCOs use a phase modulator to generate a phase-modulated local oscillator signal, the phase-modulated signal modulates the output voltage generated by a power amplifier, and the modulated output voltage from the power amplifier modulates the output frequency of the VCO. A sequence of data bits can be converted to a sequence of instantaneous phases for use in modulating the local oscillator by the phase modulator. For example, a digital system converts the sequence of instantaneous phases into a sequence of digital codes, and a digital-to-time converter in the VCO converts the sequence of digital codes into the phase-modulated local oscillator signal. Conventionally, the digital-to-time converter in such VCOs tends to support only a limited resolution of phase information within acceptable levels of linearity and/or other design parameters. The limited phase-resolution can tend to limit the transmission bandwidth supported by the transmitter, thereby limiting the communication modes supported by the transmitter.

Embodiments described herein include novel approaches to phase modulation and interpolation that support high phase modulation resolution with high linearity. Embodiments receive a digital signal that uses a sequence of K-bit digital codes to encode a sequence of instantaneous phases for phase-modulating a local oscillator signal. A fractional divider divides a reference clock into N divided clock signals at equally spaced phase intervals and selects a pair of such signals based on first designated bits of the digital code. A fractional divider-calibrated delay line generates M delayed clock signals at equally spaced phase intervals between the selected pair of divided clock signals, and selects a pair of the delayed clock signals based on second designated bits of the digital code. A digital controlled edge interpolator generates a delayed local oscillator output signal by interpolating between the selected pair of delayed clock signals based on third designated bits of the digital code.

Figure 1A:
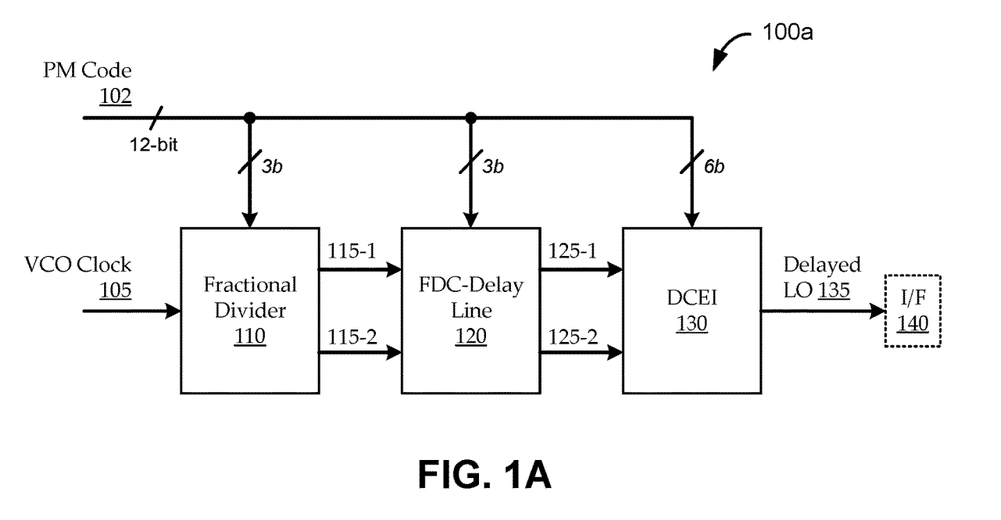
FIGS. 1A and 1B show block diagrams of phase modulator and interpolators, according to various embodiments described herein.
Figure 1B:
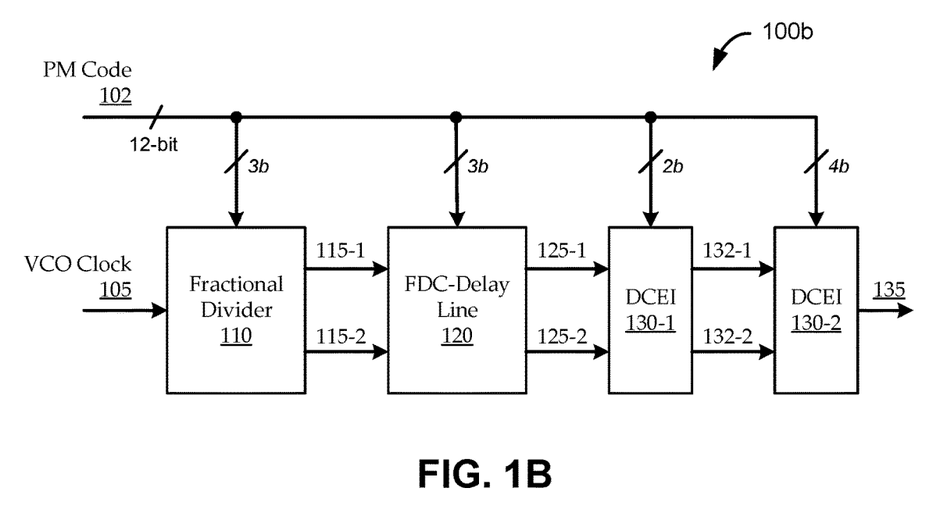

FIGS. 1A and 1B show block diagrams of phase modulator and interpolators 100, according to various embodiments described herein. Each phase modulator and interpolator 100 includes a fractional divider 110, a fractional divider-calibrated (FDC) delay line 120, and a digital controlled edge interpolator (DCEI) 130. Though not explicitly shown, the phase modulator and interpolator 100 can be part of a wireless transmitter that is based on phase-modulated transmission schemes. For example, Bluetooth® and other wireless communication standards use phase modulation to encode data in wireless signals, such that each instantaneous phase of the transmitted wireless signal encodes corresponding data in the transmitted wireless signal. The phase modulator and interpolators 100 described herein can be implemented as part of a voltage-controlled oscillator (VCO) of such a wireless transmitter. For example, the phase modulator and interpolator 100 modulates the power amplifier of the VCO, which can modulate the output frequency of the VCO.

In such a wireless transmitter, digital circuitry is used to encode the data into a stream of desired instantaneous phases and to encode each desired instantaneous phase into a digital signal that is a stream of phase-modulation (PM) codes 102 representing stream of phases, such that the sequence of digital PM codes 102 corresponds to the sequence of data to be transmitted. The phase modulator and interpolator 100 receives the PM code 102 and delays a local oscillator (VCO clock 105) signal (i.e., to modulates the phase) based on the PM code 102 to output a delayed local oscillator (LO) signal 135. The delayed LO signal 135 can be used to modulate the output of the wireless transmitter. For example, the delayed LO signal 135 is used to modulate the output of a power amplifier as part of a VCO by coupling the output from the DCEI 130 with the power amplifier and/or other components via interface 140. Thus, the digital circuitry converts a sequence of data to a sequence of PM codes 102, and the phase modulator and interpolator 100 converts the sequence of PM codes 102 to a phase modulation, which is a sequence of changing instantaneous phases of the delayed LO signal 135.

The fractional divider 110 receives a portion of the PM code 102 and a VCO clock signal 105 (i.e., a references local oscillator signal), and divide the VCO clock signal 105 frequency by a fractional (non-integer) factor to generate N divided clock signals 115. In some embodiments, the frequency of the VCO clock signal 105 ($f$) is divided by N/2. In some embodiments, the N divided clock signals 115 are evenly shifted by 360/N degrees from one another. For example, the VCO clock signal 105 is running at frequency 6.25 Gigahertz (the period is 160 picoseconds), and the fractional divider 110 divides the frequency by 2.5 to generate 5 divided clock signals 115 at 5 different phases (each signal shifted by 72 degrees from its adjacent signals, or 80 picoseconds), each having a being a 2.5 Gigahertz signal.

Having generated the N divided clock signals 115, the fractional divider 110 selects two adjacent ones of the signals, divided clock signals 115-1 and 115-2, based on the PM code 102. A first portion of the PM code 102 (e.g., a fixed subset of the bits of the PM code 102) can be designated for encoding which of the divided clock signals 115 to select as outputs from the fractional divider 110. In some implementations, the designated portion of the PM code 102 explicitly encodes a selection of only a first divided clock signal 115-1, and the second divided clock signal 115-2 is selected by the fractional divider 110 as either of the phase-adjacent signals to the selected first divided clock signal 115-1. In other implementations, the designated portion of the PM code 102 explicitly encodes selection of both the first divided clock signal 115-1 and the second divided clock signal 115-2. Embodiments of the fractional divider 110 output the selected signals such that the first divided clock signal 115-1 and the second divided clock signal 115-2 are phase-adjacent (i.e., the first phase of the first divided clock signal 115-1 and the second phase of the second divided clock signal 115-2 are separated by 360/N degrees). The fractional divider 110 selects the first and second divided clock signals 115 to have phases on either side of the encoded instantaneous phase of the signal to be transmitted by the wireless transmitter. For example, if the fractional divider 110 generates divided clock signals 115 to be 72 degrees apart, and the PM code 102 is encoding a 100-degree phase, the output of the fractional divider 110 can be the divided clock signals 115 corresponding to a 72-degree phase and a 144-degree phase.

As noted above, the fractional divider 110 is implemented with a fractional dividing factor. Some conventional transmitters use integer dividers to divide down the divided clock signal frequencies to one-half or one-fourth of the reference frequency of the VCO clock signal 105. As such, the divided clock signals have low-order harmonics (e.g., a first harmonic or a second harmonic) that is at or very near the VCO clock signal 105 frequency. In such cases, the relatively strong, low-order harmonics can exert frequency pulling on the VCO clock signal 105, which can result in spurs and/or other undesirable artifacts. By implementing the fractional divider 110 to have a fractional dividing factor, the divided-down frequencies of the divided clock signals 115 do not have low-order harmonics close to the reference frequency (f) of the VCO clock signal 105.

Embodiments of the fractional delay-calibrated (FDC) delay line 120 are coupled with the fractional divider 110 to receive the first and second divided clock signals 115. The FDC delay line 120 generates M delayed clock signals 125 using M voltage-controlled delay stages that are calibrated based on the first and second divided clock signals 115. The M delayed clock signals 125 can evenly divide the relative delay between the first and second divided clock signals 115, such that each mth delayed clock signal 125 is phase-shifted by 360/(N*M) relative to the (m−1)th and (m+1)th delayed clock signals 125. For example, if N=5 and M=8, the first and second divided clock signals 115 are separated by a 72-degree phase difference (i.e., 360/5), and the M delayed clock signals 125 are each separated by a 9-degree phase difference (i.e., 72/8, or 360/(5*8)).

Having generated the M delayed clock signals 125, the FDC delay line 120 can select a first delayed clock signal 125-1 and a second delayed clock signal 125-2 based on the PM code 102. A second portion of the PM code 102 (e.g., a fixed subset of the bits of the PM code 102 different from those used to select the divided clock signals 115) can be designated for encoding which of the delayed clock signals 125 to select as outputs from the FDC delay line 120. In some implementations, the second portion of the PM code 102 explicitly encodes a selection of only a first delayed clock signal 125-1, and the second delayed clock signal 125-2 is selected by the FDC delay line 120 as either of the phase-adjacent signals to the selected first delayed clock signal 125-1. In other implementations, the second portion of the PM code 102 explicitly encodes selection of both the first delayed clock signal 125-1 and the second delayed clock signal 125-2. Embodiments of the FDC delay line 120 output the selected signals such that the first delayed clock signal 125-1 and the second delayed clock signal 125-2 are phase-adjacent (i.e., a third phase of the first delayed clock signal 125-1 and a fourth phase of the second delayed clock signal 125-2 are separated by 360/(N*M) degrees). The FDC delay line 120 selects the first and second delayed clock signals 125 to have phases on either side of the encoded instantaneous phase of the signal to be transmitted by the wireless transmitter. For example, if the first divided clock signal 115 represent a 72-degree delay, the FDC delay line 120 generates delayed clock signals 125 to be 9 degrees apart, and the PM code 102 is encoding a 100-degree phase, the output of the FDC delay line 120 can be the delayed clock signals 115 corresponding to a 99-degree phase and a 108-degree phase.

Embodiments of the digital controlled edge interpolator (DCEI) 130 are coupled with the FDC delay line 120 to receive the first and second delayed clock signals 125. The DCEI 130 generates an interpolated clock signal 135 to be delayed relative to a reference phase (e.g., of the VCO clock signal 105) that corresponds to the instantaneous phase based on weighting an average of the phases of the first and second delayed clock signals 125 according to the PM code 102. In some embodiments, such as illustrated by FIG. 1A, the DCEI 130 is a single interpolation stage. For example, as described herein, the embodiment of FIG. 1A can implement a K-bit interpolator using $2^K$ gates to effectively provide $2^K$ levels of interpolation resolution between the delays of the first and second delayed clock signals 125.

In other embodiments, as illustrated by FIG. 1B, the DCEI 130 is more than one (e.g., two) interpolation stages. Each interpolation stage (except the final interpolation stage) can be configured to output a pair of pre-interpolation signals 132 having phases that are closer to the target encoded instantaneous phase than those of the pair of signals at its input. For example, a first interpolation stage 130-1 receives the first and second delayed clock signals 125 and outputs a pair of pre-interpolation signals 132 interpolated from the first and second delayed clock signals 125; and a second interpolation stage 130-2 receives the pair of pre-interpolation signals 132 and outputs the delayed LO signal 135 interpolated from the pair of pre-interpolation signals 132. Some multi-stage implementations can yield a particular interpolation resolution with fewer gates than a single-stage implementation. For example, a K-bit interpolator can be implemented using a first interpolation stage 130-1 having two 2-bit interpolators (to generate the pair of pre-interpolation signals 132) each with 4 gates, and a second interpolation stage having a (K−2)-bit interpolator with $2^{(K-2)}$ gates. For any K greater than or equal to 4, a two-stage implementation can reduce the number of gates. For example, a 6-bit (K=6) interpolator can be implemented using a first interpolation stage 130-1 having two 2-bit interpolators each with 4 gates, and a second interpolation stage 130-2 having a 4-bit interpolator with 16 gates, or 24 gates total. A single-stage implementation of such a 6-bit interpolator (e.g., as in FIG. 1A) may involve $2^6$, or 64 gates. While only two stages are shown in FIG. 1B, any suitable number of stages can be used. Different numbers of stages can result in different numbers of components, different output linearity, and/or other characteristics.

While specific numbers of PM code 102 bits are shown, embodiments can be implemented with any suitable numbers and distributions of bits. The illustrated implementations in FIGS. 1A and 1B use a 12-bit PM code 102. A first set of 3 bits (e.g., the 3 most significant bits, or bits b11-b9) are designated for encoding the selection of divided clock signals 115 in the fractional divider 110, a second set of 3 bits (e.g., the next 3 most significant bits, or bits b8-b6) are designated for encoding the selection of delayed clock signals 125 in the FDC delay line 120, and the remaining 6 bits (e.g., the 6 least significant bits, or bits b5-b0) are designated for weighting the average in one or multiple interpolator stages of the DCEI 130.

Figure 2:
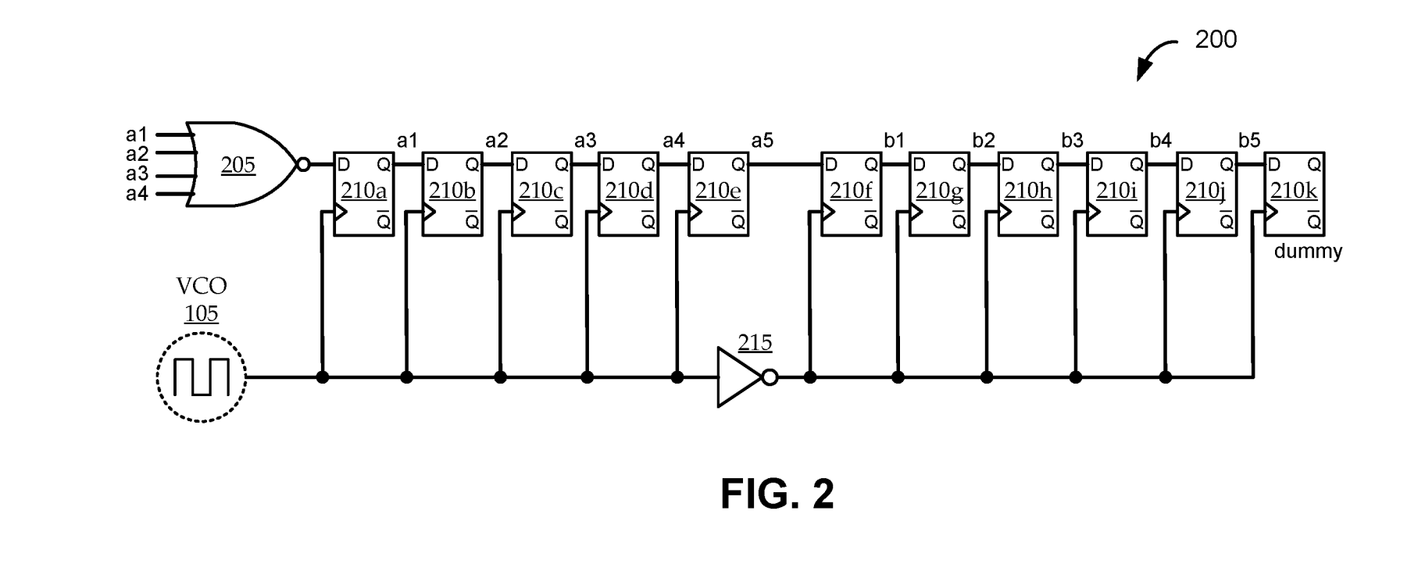
FIG. 2 shows a circuit diagram of an example implementation of a divide stage for the fractional divider, according to various embodiments described herein.
Figure 3:
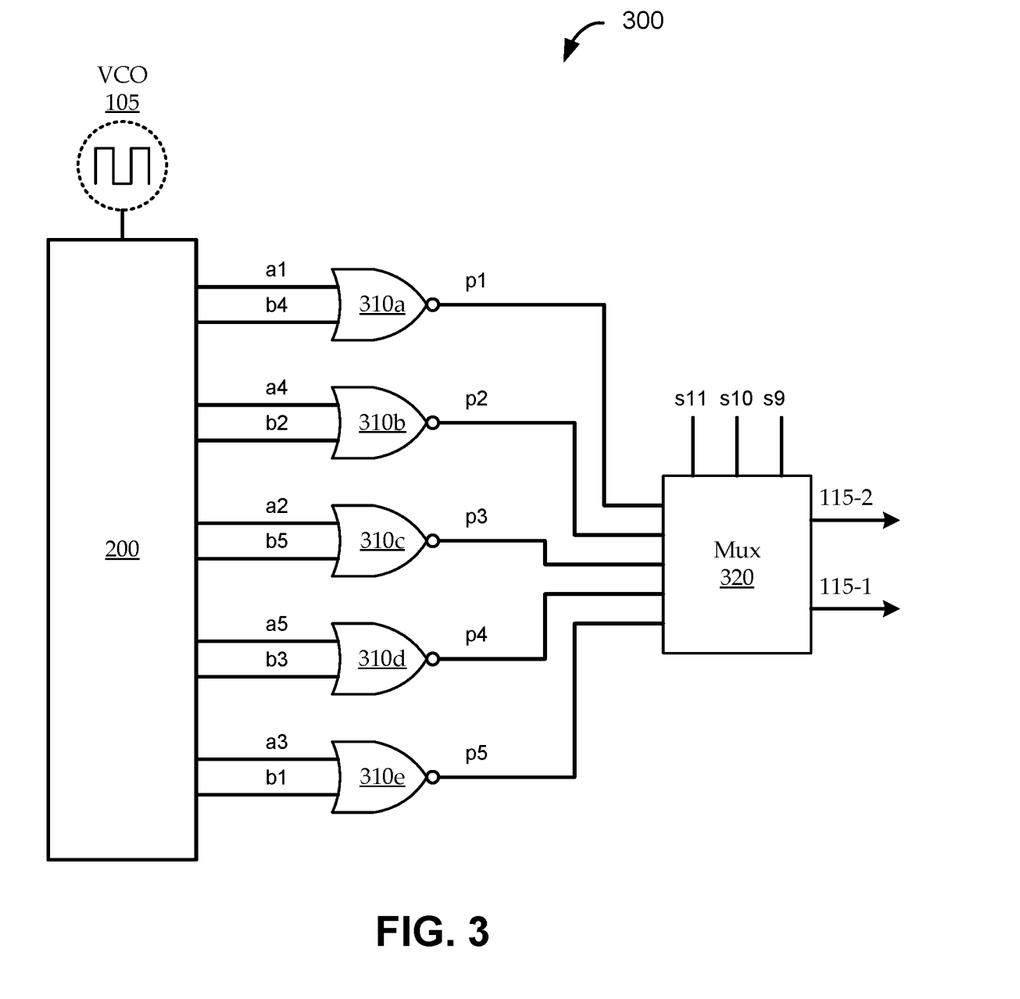
FIG. 3 shows a circuit diagram of an example implementation of a multiply stage for the fractional divider, according to various embodiments described herein.

FIG. 2 shows a circuit diagram of an example implementation of a divide stage 200 for the fractional divider 110, and FIG. 3 shows a circuit diagram of an example implementation of a multiply stage 300 for the fractional divider 110, according to various embodiments described herein. For example, a fractional divider 110 with a divide factor of 2.5 can be implemented using divide stage 200 to divide by 5, followed by multiply stage 300 to multiply by 2. Other embodiments can implement the fractional divider 110 in other ways.

Turning first to FIG. 2, the divide stage 200 receives the VCO clock signal 105, which can be, for example, a 50-percent duty cycle clock signal having a frequency (f) of 6.25 Gigahertz (GHz). The divide stage 200 divides the VCO clock signal 105 into N*2 different phases, each having a frequency of f/N. In the illustrated embodiment, N=5. For example, the illustrated divide stage 200 can generate 10 phases of the 6.25 GHz VCO clock signal 105, each having a frequency of 1.25 GHz.

The divide stage 200 can be implemented as a chain of D-flip-flops 210. A first set of N of the D-flip-flops 210 (e.g., D-flip-flops 210a-210e) are clocked by a first (e.g., rising) edge of the VCO clock signal 105, and a second set of N of the D-flip-flops 210 (e.g., D-flip-flops 210f-210j) plus an additional dummy D-flip-flop 210k are triggered by a second (e.g., falling) edge of the VCO clock signal 105. For example, the VCO clock signal 105 is passed through inverter 215 to generate an inverted clock signal for edge-triggering the second set of D-flip-flops 210. The output of each of the first set of N D-flip-flops 210 are labeled as a1-a5, and the outputs of each of the second set of N D-flip-flops 210 (except for the dummy D-flip-flops 210k) are labeled as b1-b5.

The D-flip-flops 210 are configured as a shift register, and the first D-flip-flop 210a in the shift register is fed by the output of a NOR gate 205. The NOR gate 205 generates its output as the logical NOR of outputs a1-a4 fed back from the first four D-flip-flops 210a-210d. For example, all of the D-flip-flops 210 are reset to '0' (LOW) at time t=0, such that the output of NOR gate 205 is '1' (HIGH). As such, at time t=0, the input to D-flip-flop 210a is '1', and the inputs to all other D-flip-flops 210 is '0'. At a next first edge of the VCO clock signal 105 (t=1), the output of D-flip-flop 210a becomes '1', which feeds back to the input of the NOR gate 205, such that the output of the NOR gate 205 is now '0'; the outputs of all other D-flip-flops 210 are still '0'. With each first edge of the VCO clock signal 105, the '1' propagates through the shift register from D-flip-flop 210a until it reaches D-flip-flop 210e. Thus, after five clock periods (t=5), outputs a1-a4 are all '0' again, which causes the output of the NOR gate 205 to become '1' and starts the cycle again. Also at t=5, the input to D-flip-flop 210f (the first of the second set of D-flip-flops 210) is '1'. A half clock period later (t=5.5), at the next second edge of the VCO clock signal 105, the '1' begins propagating through the second set of D-flip-flops 210 until it reaches the dummy D-flip-flop 210k. Meanwhile, one half-cycle of the VCO clock signal 105 after each propagation in the second set of D-flip-flops 210, there is a corresponding propagation in the first set of D-flip-flops 210. For example, a '1' shifts from b1 to b2, and a half clock period later, a '1' shifts from a1 to a2.

Thus, the first and second sets of D-flip-flops 210 effectively operate as two shift registers running in parallel, but shifted by one half clock period. As such, the signal at each of a1-a5 is a substantially identical pulse with a period of f/5 and a duration of one half-period of the VCO clock signal 105, each delayed (phase-shifted) from its adjacent outputs by one clock period of the VCO clock signal 105. Similarly, the signal at each of b1-b5 is a substantially identical pulse with a period of f/5 and a duration of one half-period of the VCO clock signal 105, each delayed from its adjacent outputs by one clock period of the VCO clock signal 105, all delayed from the a1-a5 output signals by a half-period of the VCO clock signal 105. Thus, a1-a5 and b1-b5 represent pulse signals of 10 different phases, each at a same frequency of f/5.

Turning to FIG. 3, the divide stage 200 is shown for context, including the VCO clock signal 105 at its input and the N*2 (e.g., 10) signals at N*2 different phases as its outputs. As described above, each of the N*2 output signals of the divide stage 200 has a frequency of f/N. Pairs of the output signals from the divide stage 200 can be used by the multiply stage 300 to generate N divided clock signals 115 of different phases. For example, pairs of those signals are passed as inputs to N NOR gates 310 to generate the N divided clock signals 115. The divided clock signals 115 are generated so that each is a substantially identical clock signal with a frequency of 2f/N, and each is delayed (phase-shifted) from its phase-adjacent neighbors by 360/N degrees.

In the illustrated embodiment, the divide stage 200 outputs 10 pulse signals, a1-a5 and b1-b5. Pairs of the signals are passed as inputs to 5 NOR gates 310a-310e, and each pair is selected to produce a respective one of the divided clock signals 115. For example, a1 and b4 are delayed from each other by 2.5 clock periods of the VCO clock signal 105, such that the output of NOR gate 310a (having a1 and b4 as its inputs) is a signal having a frequency of f/2.5. For example, the VCO clock signal 105 runs at 6.25 GHz, each output of the divide stage 200 has a frequency of 1.25 GHz, and the output of each NOR gate 310 (labeled as p1-p5) is a divided clock signal 115 with a frequency of 2.5 GHz. In the illustrated embodiment, the NOR gates 310 are arranged so that each outputs a respective divided clock signal 115 that is phase-shifted by 360/N (e.g., 72 degrees) from its neighbors. For example, divided clock signals 115 at a VCO clock signal 105 frequency of 6.25 GHz, each clock period is 400 picoseconds (ps), and the rising edges of each divided clock signal 115 is shifted by 80 ps (400/5) from the rising edges of its neighbors.

The N (e.g., 5) generated divided clock signals 115 can be passed as inputs to a multiplexer 320. The multiplexer has an integer number of select bits greater than log2(N), which are designated bits of the PM code 102. In the illustrated case where N=5, the multiplexer 310 has 3 select bits, which are the 3 most significant bits of the PM code 102 (s11, s10, and s9). For example, the values of the 3 most significant bits of the PM code 102 can range from '000' binary (or '0' decimal, corresponding to the p1 signal) to '100' binary (or '4' decimal, corresponding to the p5 signal) to select from among the 5 divided clock signals 115. Thus, the select bits are used to select among the divided clock signals 115, so that the multiplexer 320 outputs a selection of a first divided clock signal 115-1 and a second divided clock signal 115-2. In some embodiments, the select bits select one of the divided clock signals 115, and the multiplexer 320 automatically outputs that one as the first divided clock signal 115-1 and outputs the next (e.g., or previous) phase-adjacent one as the second divided clock signal 115-2. For example, if the select bits are '010' (decimal '2'), the multiplexer 320 can output the p3 signal as the first divided clock signal 115-1 and can output the p4 (e.g., or p2) signal as the second divided clock signal 115-2.

Figure 4:
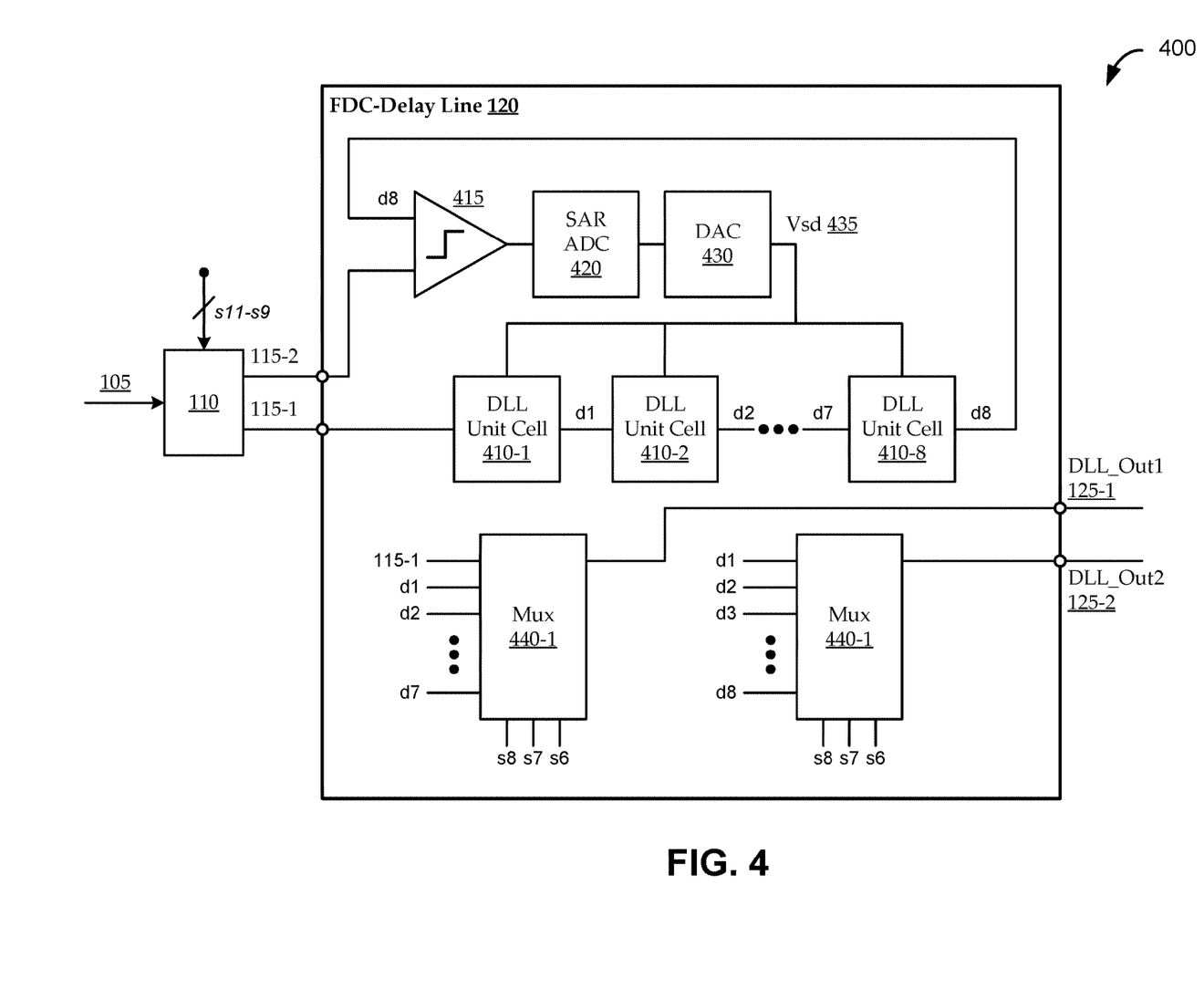
FIG. 4 shows a circuit block diagram of an illustrative FDC delay line, according to various embodiments described herein.

FIG. 4 shows a circuit block diagram of an illustrative FDC delay line 400, according to various embodiments described herein. The FDC delay line 400 can be an implementation of the FDC delay line 120 of FIG. 1. The FDC delay line 400 can provide coarse delay tuning so that the subsequent DCEI 130 can interpolate between a smaller delay, thereby improving linearity. For example, using a divide factor of 2.5 for a 6.25 GHz VCO clock signal 105, the divided clock signals 115 output by the fractional divider 110 are separated by 80 ps, which can be too large of a delay to interpolate with acceptable linearity in some cases. Thus, the FDC delay line 400 can use the two divided clock signals 115 to calibrate a total delay of a M-stage delay line, thereby generating M delayed clock signals 125 at M equally-spaced phases. As such, the delayed clock signals 125 are each phase-shifted by 360/(N*M) degrees. For example, a pair of divided clock signals 115 separated by 80 ps is used to calibrate an 8-stage delay line, such that the output of the delay line is 8 delayed clock signals 125 each separated by 10 ps (i.e., 80/8 picoseconds).

Figure 5:
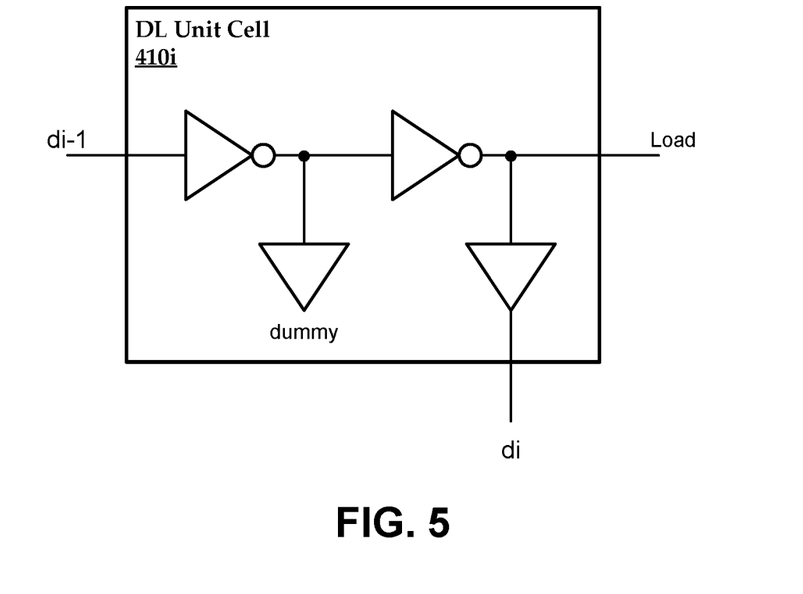
FIG. 5 shows a circuit block diagram of an illustrative implementation of a DLL unit cell.

As illustrated, the FDC delay line 400 includes M DLL unit cells 410. Each DLL unit cell 410 is a voltage-controlled delay stage, such as a delay locked loop. The output of M DLL unit cells 410 are labeled as d1-dM (the illustrated example includes 8 DLL unit cells 410 having outputs d1-d8). FIG. 5 shows a circuit block diagram of an illustrative implementation of a DLL unit cell 410. As illustrated, the DLL Unit cell 410 can include two successive inverters and a buffer. A dummy buffer can be used for load and impedance balancing of the inverters. The input to each DLL unit cell 410 (i.e., the input to the first inverter), d(i−1), is either the first divided clock signal 115-1 in the case of the first DLL unit cell 410-1, or is the output of the preceding DLL unit cell 410 for all other DLL unit cells 410. The output of each DLL unit cell 410 (i.e., the output of the second inverter), di, is a delayed version of the input, d(i−1). The delay of each DLL unit cell 410 is controlled by the supply voltage feeding the inverters and the buffers.

Returning to FIG. 4, the supply voltage 435 feeding the DLL unit cells 410 is controlled and calibrated based on the second divided clock signal 115-2, so that each of the M DLL unit cells 410 generates 1/Mth of the delay from the first divided clock signal 115-1 to the second divided clock signal 115-2. As illustrated, the supply voltage 435 is calibrated using an edge comparator 415, a successive approximation register (SAR) analog to digital converter (ADC) 420, and a digital to analog converter (DAC) 430. The first divided clock signal 115-1 is input to the first DLL unit cell 410-1 and is delayed M times (by each of the M DLL unit cells 410), so that a particular rising edge of the first divided clock signal 115-1 and the same rising edge of the dM output are separated by the M delays of the M DLL unit cells 410. The dM output is fed back and compared to the second divided clock signal 115-2 by the edge comparator 415. Thus, the output of the edge comparator 415 indicates how closely the total delay over the M DLL unit cells 410 matches the delay between the first and second divided clock signals 115. The SAR ADC 420 uses successive approximation to generate a digital output based on the output of the edge comparator 415, and the DAC 430 converts the digital output to the analog supply voltage 435 level.

The edge comparator 415, SAR ADC 420, and DAC 430 form a SAR feedback loop that controls the supply voltage 435 level in such a way that calibrates the total delay over all the DLL unit cells 410 to the delay between the first and second divided clock signals 115. By providing M substantially identical DLL unit cells 410, each DLL unit cell 410 generates 1/Mth of the total calibrated delay, which is substantially equal to 1/Mth of the delay between the divided clock signals 115. Thus, each output of the DLL unit cells 410 (d1-dM) is a delayed clock signal 125 that is phase-shifted by 360/(M*N) degrees from its neighbors.

The first divided clock signal 115-1 and the M delayed clock signals 125 are passed as inputs to two M-input multiplexers 440. The M inputs of the first multiplexer 440-1 are the first divided clock signal 115-1 and the first M-1 of the delayed clock signals 125. The M inputs of the second multiplexer 440-2 are the M delayed clock signals 125. Each multiplexer 440 can have an integer number of bits that is at least log2(M), which can be designated bits of the PM code 102. In the illustrated embodiment, M-8, such that there are 8 delay stages to generate 8 delayed clock signals 125, and 3 bits (i.e., log2(8) bits) corresponding to bits s8, s7, and s6 of the PM code 102 are used as the select bits for both multiplexers 440. By using the same select bits for both multiplexers 440 and by arranging the multiplexer 440 inputs as described, selecting a same input from both multiplexers 440 results in the multiplexers 440 outputting phase-adjacent delayed clock signals 125 (i.e., signals delayed from each other by 360/(N*M) degrees). For example, if the select bits are set to '011' (or '3' decimal), the output of the first multiplexer 440-1 is a first delayed clock signal 125-1 corresponding to d2 (the output of DLL unit cell 410-2), and the output of the second multiplexer 440-2 is a second delayed clock signal 125-2 corresponding to d3 (the output of DLL unit cell 410-3), which is one delay stage later. It can be seen that, in some instances, the selected first delayed clock signal 125-1 can correspond to the first divided clock signal 115-1. As such, while descriptions refer to the FDC delay line 400 as generating and selecting from among M delayed clock signals 125, it will be understood that the M-way selection of the FDC delay line 400 involves M+1 signals (including the first divided clock signal 115-1), and the first divided clock signal 115-1 can be considered as included in the delayed clock signals 125 in cases where it is selected as the first delayed clock signal 125-1.

Figure 6:
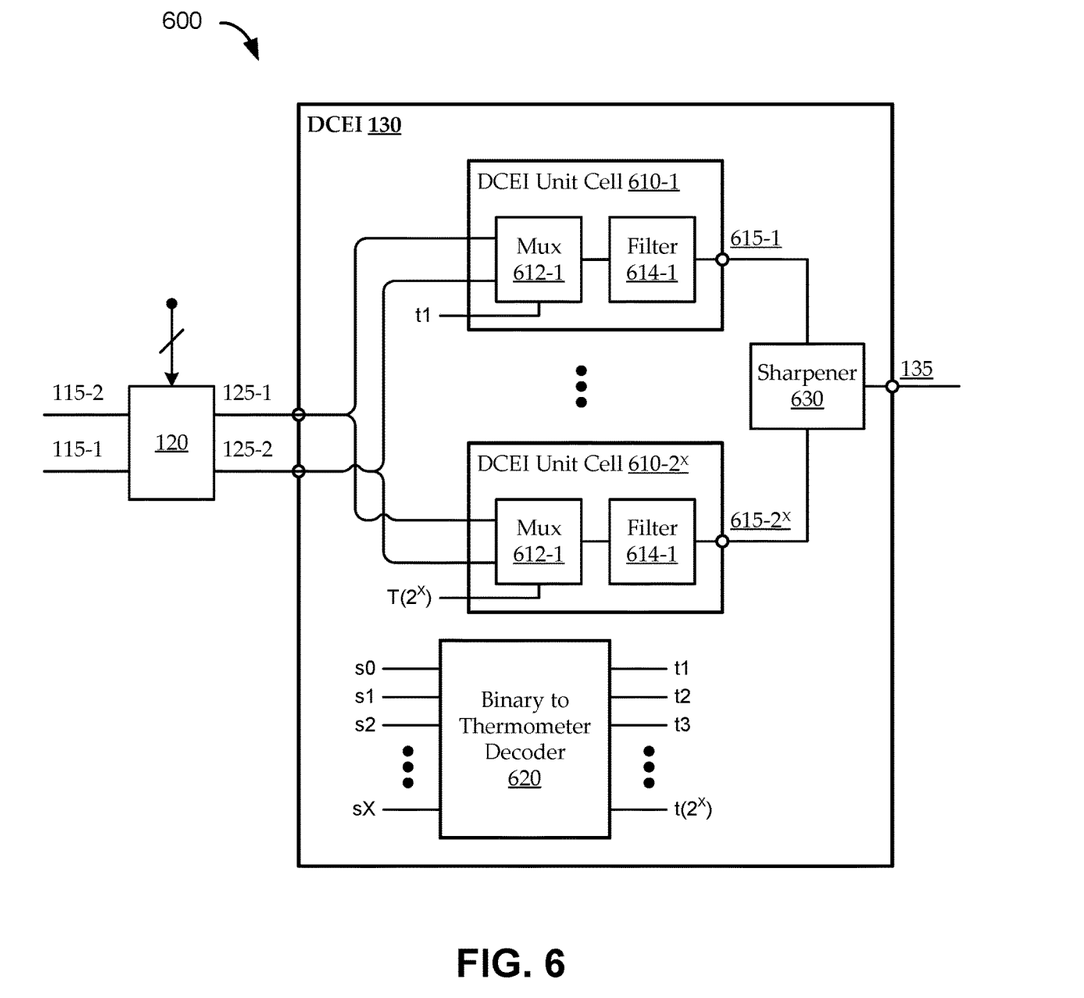
FIG. 6 shows a circuit block diagram including an illustrative digital-controlled edge interpolator (DCEI), according to various embodiments described herein.

FIG. 6 shows a circuit block diagram 600 including an illustrative digital-controlled edge interpolator (DCEI) 130, according to various embodiments described herein. The DCEI 130 can be an implementation of the DCEI 130 of FIG. 1. The DCEI 130 can provide fine delay tuning by applying one or more interpolation stages to outputs of the FDC delay line 120 (e.g., of FDC delay line 400 of FIG. 4). For the sake of context, the FDC delay line 120 is illustrated as receiving a pair of divided clock signals 115 and outputting a pair of delayed clock signals 125 based on designated selection bits of the PM code 102.

Embodiments of the DCEI 130 are implemented based on thermometer decoding. The illustrated DCEI 130 includes a binary-to-thermometer decoder 620 that generates 2^X outputs (labeled t1-t(n^X)) based on X selector inputs. The X selector inputs correspond to X bits of the PM code 102. For example, the X least significant bits (e.g., all bits other than those used as select bits in the fractional divider 110 and the FDC delay line 120) are used as select bits for the binary-to-thermometer decoder 620. The binary-to-thermometer decoder 620 asserts a number of its output bits corresponding to the binary value of its input bits. For example, 6 bits of the PM code 102 can encode 64 values from '000000' to '111111' binary ('0' to '63' decimal). As two examples, setting the select bits to '000111' causes the binary-to-thermometer decoder 620 to assert (e.g., set to logic 'HIGH', binary '1', etc.) 8 outputs corresponding to t1-t8, and setting the select bits to '111111' causes the binary-to-thermometer decoder 620 to assert 64 of its outputs corresponding to t1-t64.

Embodiments of the DCEI 130 include 2^X DCEI unit cells 610, each having an input coupled with a respective one of the outputs of the binary-to-thermometer decoder

620. Each DCEI unit cell 610 includes a multiplexer instance 612 that receives the first delayed clock signal 125-1 and the second delayed clock signal 125-2 as inputs and receives the respective one of the binary-to-thermometer decoder 620 outputs as its select bit. The output of each multiplexer instance 612 is either the first delayed clock signal 125-1 or the second delayed clock signal 125-2, depending on whether the respective binary-to-thermometer decoder 620 output is asserted. Thus, the binary value of the select bits at the input to the binary-to-thermometer decoder 620 determines the number of multiplexer instances 612 that will output the first delayed clock signal 125-1 and the number of multiplexer instances 612 that will output the second delayed clock signal 125-2. For example, setting the select bits to '000100' (or '4' decimal) can cause 5 of the multiplexer instances 612 to output the first delayed clock signal 125-1 and ($2^X$)–5 of the multiplexer instances 612 to output the second delayed clock signal 125-2.

In some implementations, the outputs of the multiplexer instances 612 are used as the outputs of the DCEI unit cells 610 (labeled as 615). In other implementations, each DCEI unit cell 610 further includes a filter instance 614, such that outputs 615 of the DCEI unit cells 610 are the outputs of the filter instances 614. In some embodiments, each filter instance 614 is implemented as an RC filter (e.g., an RCR filter) to improve linearity of the interpolation. Outputs 615 from the DCEI unit cells 610 can be shorted together to generate an interpolated output that has a delay (an edge location) that is effectively an average of the delays (edge locations) of the pair of delayed clock signal 125 weighted by the selected number of binary-to-thermometer decoder 620 outputs. For example, setting the select bits of the binary-to-thermometer decoder 620 to assert half of the binary-to-thermometer decoder 620 outputs (e.g., t1–t(($2^X$)/2)) causes that half of the DCEI unit cells 610 to generate an output 615 based on the first delayed clock signal 125-1, while the other half of the DCEI unit cells 610 generates an output 615 based on the second delayed clock signal 125-2. Shorting together all those outputs 615 can yield a delayed LO signal 135 having edge locations approximately half-way between those of the pair of delayed clock signal 125. In a corresponding manner, the delayed LO signal 135 can be delayed to any of $2^X$ delay locations between the pair of delayed clock signal 125 based on the setting of the select bits of the binary-to-thermometer decoder 620. In some embodiments, as illustrated, the shorted outputs of the DCEI unit cells 610 are passed to a sharpener 630 that can sharpen the interpolated edges of the generated delayed LO signal 135.

Figure 7:
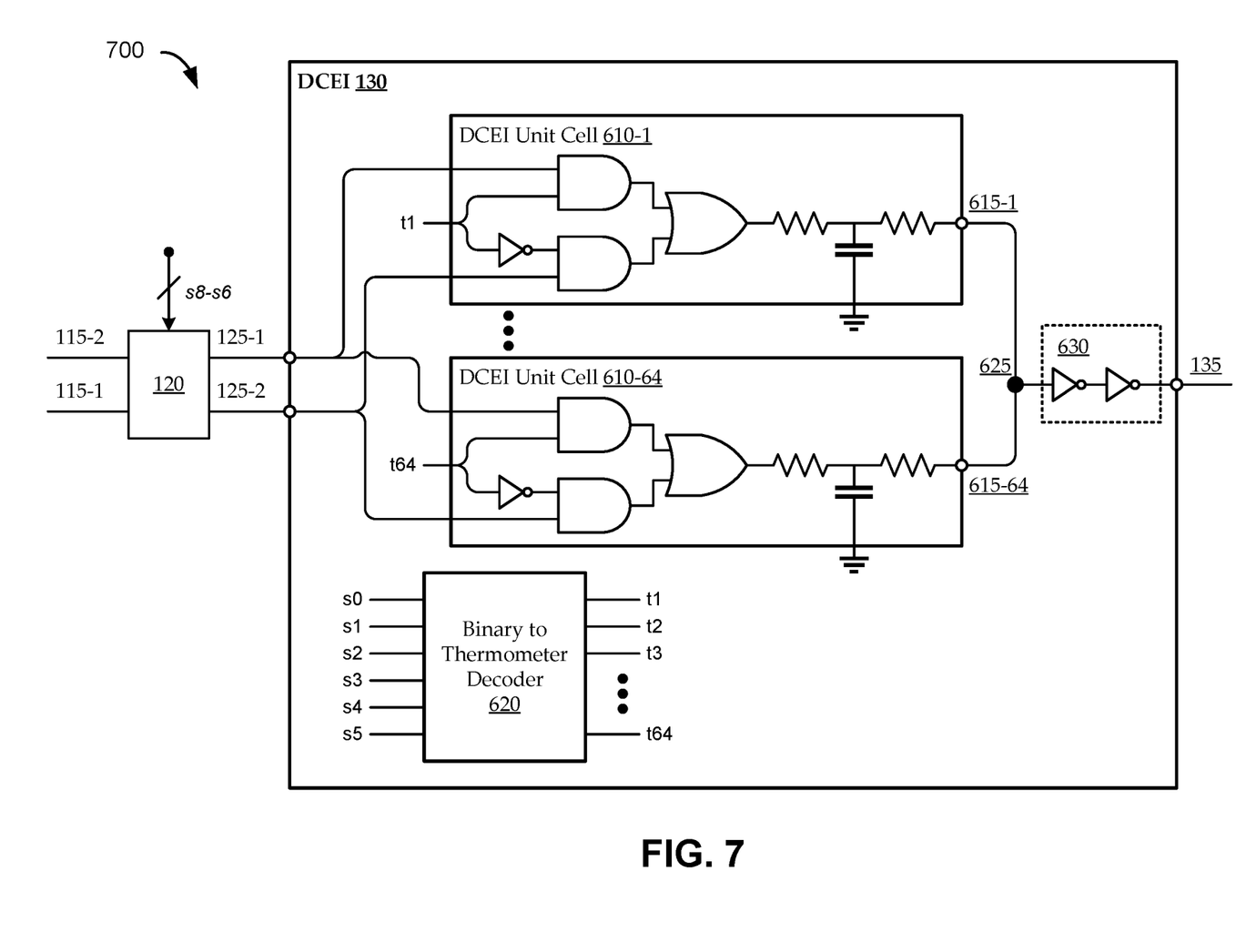
FIG. 7 shows a circuit block diagram including a specific implementation of the circuit block diagram of FIG. 6 for 6-bit encoding, according to various embodiments described herein.

FIG. 7 shows a circuit block diagram 700 including a specific implementation of the circuit block diagram 600 of FIG. 6 for 6-bit encoding, according to various embodiments described herein. For the sake of context, the FDC delay line 120 is illustrated as receiving a pair of divided clock signals 115 and outputting a pair of delayed clock signals 125 based on 3 designated bits (s8-s6) of the PM code 102. The remaining 6 bits (s5-s0) of the PM code 102 are used as select bits of the binary-to-thermometer decoder 620, so that the binary-to-thermometer decoder 620 has 64 outputs, t1-t64. Each binary-to-thermometer decoder 620 output is used as the select bit of a respective one of the multiplexer instances 612 of one of 64 DCEI unit cells 610.

As illustrated, each multiplexer instance 612 can be implemented as a pair of AND gates coupled with an OR gate. The first AND gate is coupled with the first delayed clock signal 125-1 and the respective binary-to-thermometer decoder 620 output, and the second AND gate is coupled with the second delayed clock signal 125-2 and the complement (e.g., inverted) of the respective binary-to-thermometer decoder 620 output. Thus, asserting the respective binary-to-thermometer decoder 620 output causes the first AND gate to correspond to the first delayed clock signal 125-1 and the output of the second AND gate to be held at '0'; de-asserting the respective binary-to-thermometer decoder 620 output causes the second AND gate to correspond to the second delayed clock signal 125-2 and the output of the first AND gate to be held at '0'. The outputs of the AND gates are coupled as inputs to the OR gate, such that the output of the OR gate is either the first or the second delayed clock signal 125, depending on the state of the respective binary-to-thermometer decoder 620 output. Each DCEI unit cell 610 can further include a filter instance 614 implemented as a RCR filter. As illustrated, the output of the multiplexer instance 612 (i.e., the output of the OR gate) is passed through the RCR filter to smooth the response at the output 615 to the DCEI unit cells 610.

The outputs 615 of all the DCEI unit cells 610 can be shorted at node 625, such that the signal at node 625 has a delayed edge location that is an average of the edge locations of the pair of delayed clock signals 125 weighted by the proportion of DCEI unit cells 610 that selected each of the delayed clock signals 125 according to the binary-to-thermometer decoder 620. In some embodiments, the signal at node 625 can be used as the delayed LO signal 135. In other implementations, the shorted outputs 615 at node 625 are passed to a sharpener 630. As illustrated, the sharpener 630 can be implemented as a pair of series-connected inverters. Passing the shorted outputs through the series-connected inverters can sharpen the interpolated edges of the generated delayed LO signal 135.

While FIGS. 6 and 7 show embodiments of X-bit DCEIs 130 implemented by a single stage using $2^X$ DCEI unit cells 610. Alternatively, the DCEI 130 can be implemented in multiple stages using fewer DCEI unit cells 610. For example, FIG. 7 shows a 6-bit DCEI 130 implemented with 64 DCEI 130. Alternatively, the 6-bit DCEI 130 can be implemented as a first 2-bit DCEI stage and a second 4-bit DCEI stage, still yielding a 6-bit interpolation resolution. In such an embodiment, the first 2-bit DCEI stage can be implemented as two 2-bit DCEIs in parallel to generate a pair of pre-interpolation signals. The pre-interpolation signals represent phase-adjacent outputs of a 2-bit interpolator (with an interpolation resolution of $2^2=4$). For example, the input to the first stage is the pair of delayed clock signals 125, separated by 360/(N*M) degrees, and the output from the first stage is a pair of pre-interpolation signals separated by 360/(N*M*4) degrees. The pair of pre-interpolation signals is passed to the 4-bit interpolation stage, which has an interpolation resolution of $2^4=16$. For example, the input to the second stage is the pair of pre-interpolation signals separated by 360/(N*M*4) degrees, and the output from the second stage is the delayed LO signal 135, which is delays to a selected one of 16 places. Thus, the total interpolation resolution is 360/(N*M*4*16), or 36/(N*M*64), which is the same as that of the 6-bit interpolator of FIG. 7. However, while the single-stage 6-bit implementation of FIG. 7 uses 64 DCEI unit cells 610, the two-stage 6-bit implementation uses only 24 DCEI unit cells 610: the first DCEI includes 8 DCEI unit cells 610 (two 2-bit DCEIs, each with 4 DCEI unit cells 610), and the second DCEI includes 16 DCEI unit cells 610 (one 4-bit DCEI).

Figure 8:
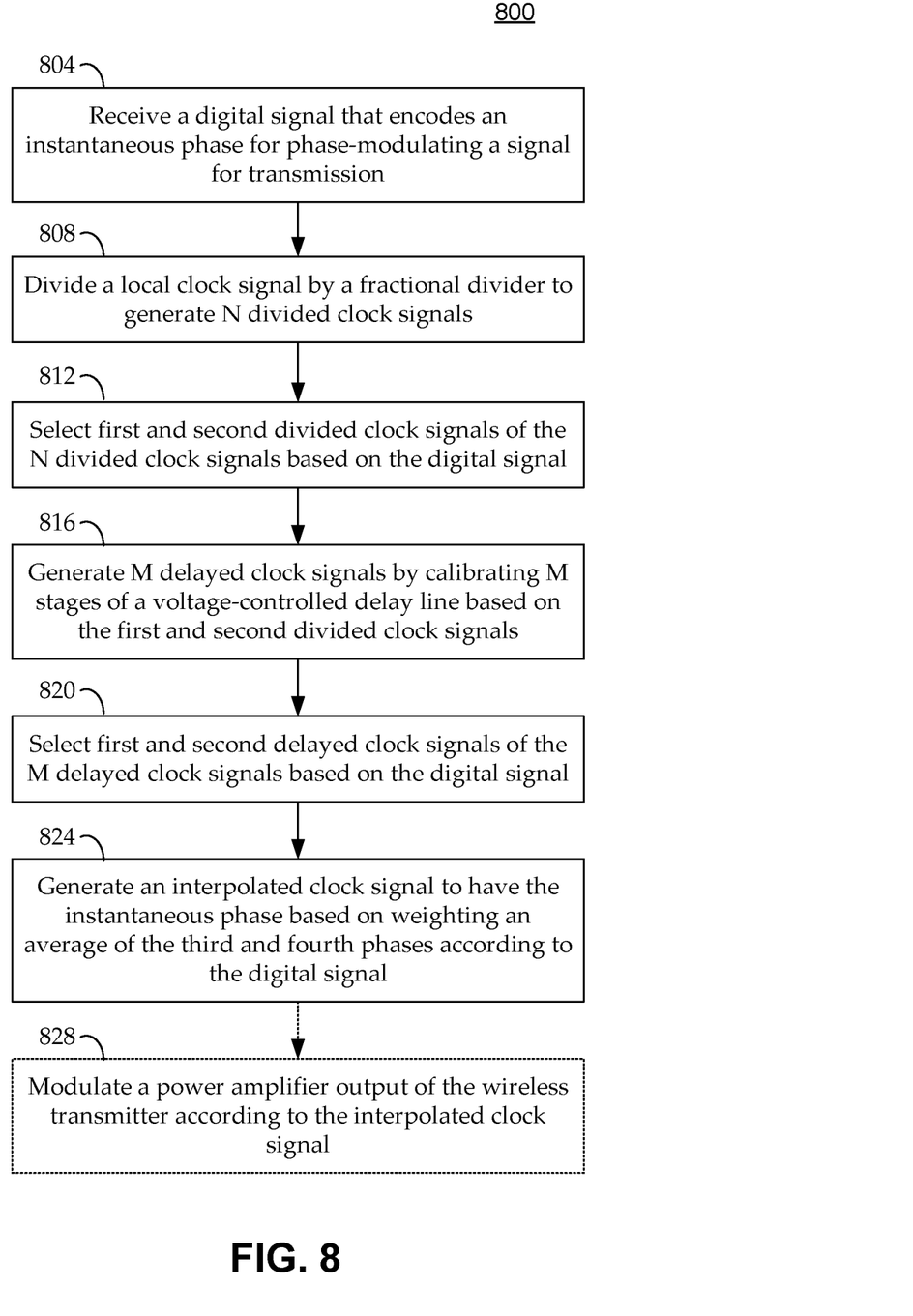
FIG. 8 shows a flow diagram of an illustrative method for phase modulation and interpolation in a wireless transmitter, according to various embodiments described herein.

FIG. 8 shows a flow diagram of an illustrative method 800 for phase modulation and interpolation in a wireless transmitter, according to various embodiments described herein.

Embodiments of the method 800 begin at stage 804 by receiving a digital signal that encodes an instantaneous phase for phase-modulating a signal for transmission. In a transmission system that uses phase-modulation, it can be desirable to modulate a voltage-controlled oscillator (VCO) based on the modulated phase of the signal at the output of a modulator system. For example, a phase-modulated output signal is used to modulate a power amplifier, which controls the output frequency of the VCO. At any particular instant in time, the phase of the signal at the output of the modulator system is the instantaneous phase of the signal. The instantaneous phase is relative to a reference phase of a reference clock signal, such as a VCO clock signal. The phase modulation (i.e., the sequence of instantaneous phases) is used to encode data bits being transmitted. In some systems, a digital controller converts the data bits to instantaneous phases, and encodes each instantaneous phase as a digital code value. For example, the digital signal received at stage 804 is a bitstream, and each set of K bits (e.g., 12 bits) of the bitstream is a K-bit code that encodes a desired instantaneous phase to be seen at the output of a phase modulator and interpolator system.

At stage 808, embodiments divide a local clock signal (e.g., by a fractional divider) to generate N divided clock signals. The divided clock signals are generated so that each is separated by a phase shift of approximately 360/N degrees. Each of the divided clock signals can further be generated at stage 808 to have a frequency that is a non-integer fraction of the reference frequency (f) of the local clock signal. For example, each of the N divided clock signals has a frequency of 2f/N. In some embodiments, the divided clock signals are generated at stage 808 using a divide stage and a multiply stage. For example, a divide-by-5 stage followed by a multiply-by-2 stage can yield a divide-by 2.5 fractional divider.

At stage 812, embodiments select first and second divided clock signals of the N divided clock signals based on the digital signal. The divided clock signals are generated so that the instantaneous phase (as encoded by the digital signal) is greater than or equal to a first phase of the first divided clock signal and less than or equal to a second phase of the second divided clock signal. As described above, the selected second divided clock signal is delayed from the selected first divided clock signal by 360/N degrees.

At stage 816, embodiments generate M delayed clock signals by calibrating M stages of a voltage-controlled delay line based on the first and second divided clock signals. For example, a feedback loop is used to calibrate a total delay across all M delay stages to the delay between the first and second divided clock signals (360/N degrees of phase delay). By implementing M substantially identical delay stages, each delay stage is calibrated to provide approximately 1/Mth of the total delay. Thus, the output of each delay stage (e.g., each of a series of delay unit cells) is phase-shifted by 360/(N*M) degrees relative to its neighbors.

At stage 820, embodiments select first and second delayed clock signals of the M delayed clock signals based on the digital signal. The generation in stage 816 and selection in stage 820 provide a coarse phase tuning by a factor of M. The selection in stage 820 is such that the instantaneous phase is greater than or equal to a third phase of the first delayed clock signal and less than or equal to a fourth phase of the second delayed clock signal. As described above, the third and fourth phases are separated by 360/(N*M) degrees.

At stage 824, embodiments generate an interpolated clock signal to have the instantaneous phase based on weighting an average of the third and fourth phases according to the digital signal. In some embodiments, the generating in stage 824 includes using a first interpolator stage to generate first and second pre-interpolated signals by weighting the average of the third and fourth phases according to the digital signal; and using a second interpolator stage to generate the interpolated clock signal to have the instantaneous phase based on weighting an average of the fifth and sixth phases according to the digital signal. For example, X-bit interpolation can yield $2^X$ levels of interpolation resolution. In some embodiments, a single X-bit interpolation stage is used. In other embodiments, multiple interpolator stages are used to achieve X-bit interpolation. For example, a first X1-bit interpolator stage yields a fifth phase of the first pre-interpolated signal and the sixth phase of the second pre-interpolated signal to be separated by approximately 360/(N*M*X1) degrees; and a second X2-bit interpolator stage yields a delayed LO signal that represents interpolation to a phase within a selected range of approximately 360/(N*M*X1*X2) degrees. If X=X1+X2, the two-stage approach yields an X-bit interpolation resolution (i.e., to select from $2^X$ interpolation levels).

Some embodiments continue at stage 828 by modulating a power amplifier output of a VCO according to the interpolated clock signal.

As an example, suppose the digital signal (e.g., a PM code within the signal) is set to encode an instantaneous phase of 101 degrees. A 12-bit code is used, wherein 3 bits encodes selection from among 5 generated divided clock signals, another 3 bits encodes selection from among 8 generated delayed clock signals, and the remaining 6 bits encodes selection from among 64 interpolation levels. In stage 808, 5 divided clock signals are generated to be 72 degrees apart. The divided clock signals selected in stage 812 represent phases of 72 degrees and 144 degrees, on either side of the encoded instantaneous phase of 101 degrees. In stage 816, 8 delayed clock signals are generated to be 9 degrees apart (between 72 and 144 degrees). The delayed clock signals selected in stage 820 represent phases of 99 degrees and 108 degrees, on either side of the encoded instantaneous phase of 101 degrees. In stage 824, the 6-bit interpolator generates 64 interpolation levels between 99 and 108 degrees, such that each is approximately 0.14 degrees apart. The output of the interpolator can thus be approximately 100.96 or 101.1 degrees, the closest interpolation levels on either side of the encoded instantaneous phase of 101 degrees.

The embodiments disclosed herein are not limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A phase modulation and interpolation system for a wireless transmitter, the system comprising:
   a fractional divider to:
   divide a local clock signal to generate N divided clock signals; and
   output first and second divided clock signals of the N divided clock signals selected based on a digital signal that encodes instantaneous phase for phase-modulating a signal for transmission, N being an integer greater than 1, the instantaneous phase being greater than or equal to a first phase of the first divided clock signal and less than or equal to a second phase of the second divided clock signal, the first and second phases being separated by 360/N degrees;

a fractional delay-calibrated (FDC) delay line coupled with the fractional divider to:
generate M delayed clock signals using M stages of a voltage-controlled delay line that are calibrated based on the first and second divided clock signals, M being an integer greater than 1; and
output first and second delayed clock signals of the M delayed clock signals selected based on the digital signal, the instantaneous phase being greater than or equal to a third phase of the first delayed clock signal and less than or equal to a fourth phase of the second delayed clock signal, the third and fourth phases being separated by 360/(N*M) degrees; and a digital controlled edge interpolator (DCEI) coupled with the FDC delay line to:
generate an interpolated clock signal to have the instantaneous phase based on weighting an average of the third and fourth phases according to the digital signal; and
output the interpolated clock signal.

2. The system of claim 1, further comprising:
an output interface to couple the DCEI with a power amplifier of a voltage-controlled oscillator, such that a voltage output by the power amplifier is modulated according to the interpolated clock signal.

3. The system of claim 1, wherein:
the local clock signal has a reference frequency (f); and
the fractional divider comprises:
a divide stage to divide the local clock signal into a plurality of pre-divided clock signals, such that each pre-divided clock signal has a frequency of f/N; and
a multiply stage to multiply the plurality of pre-divided clock signals by P to generate the N divided clock signals, such that each divided clock signal has a frequency of f*P/N, wherein P is a positive integer and P/N is not an integer.

4. The system of claim 1, wherein the fractional divider includes a divide stage comprising:
a first shift register having a first N stages, each of the first N stages triggered by a first edge of each clock period of the local clock signal, the first N stages generating first shifted outputs (a1–aN), respectively;
a second shift register having a second N stages, each of the second N stages triggered by a second edge of each clock period of the local clock signal, the second N stages generating second shifted outputs (b1–bN), respectively, wherein a data input of the first of the second N stages is coupled with first shifted output (aN); and
feedback logic to assert a data input of the first of the first N stages when all of first shifted outputs (a1–a(N–1)) are de-asserted, and to de-assert the data input of the first of the first set of N stages otherwise.

5. The system of claim 4, wherein the fractional divider further includes a multiply stage comprising:
N logic circuits, each to generate a respective one of the N divided clock signals responsive to concurrently receiving a respective one of the first shifted outputs and a respective one of the second shifted outputs.

6. The system of claim 1, wherein:
the digital signal encodes the instantaneous phase as a set of K bits, K being a positive integer; and
the fractional divider includes a multiplexer comprising:
N selectable inputs, each to receive a respective one of the N divided clock signals; and
selector bits, each to receive a respective one of a designated subset of the K bits,
wherein the multiplexer selects and outputs the first and second divided clock signals from among the N selectable inputs based on digital states of the selector bits.

7. The system of claim 6, wherein:
the digital states of the selector bits encode selection only of the first divided clock signal, such that the multiplexer selects and outputs the first divided clock signal based on the digital states of the selector bits, and the multiplexer selects and outputs the second divided clock signal based on selection of the first divided clock signal.

8. The system of claim 1, wherein the FDC delay line comprises:
M delay stages, each to output a respective one of the M delayed clock signals that is delayed by an amount (D) relative to a signal received at its input, wherein the first of the M delay stages receives the first divided clock signal at its input, and each subsequent mth one of the M delay stage receives the output of the (m–1)th one of the M delay stages at its input, D being controllable based on a supply voltage; and
a feedback control loop to control the supply voltage to calibrate D so that M*D equals a phase delay between the second divided clock signal and the first divided clock signal.

9. The system of claim 8, wherein the feedback control loop comprises:
an edge comparator to compare an edge of the second divided clock signal with a corresponding edge an output of a last of the M delay stages;
a successive approximation register (SAR) analog to digital converter (ADC) to adjust a digital level based on an output of the edge comparator, and
a digital to analog converter (DAC) to adjust the supply voltage based on the digital level.

10. The system of claim 8, wherein each of the M delay stages comprises:
a first inverter and a second inverter coupled in series, each supplied by the supply voltage;
an output buffer supplied by the supply voltage and coupled with an output of the second inverter; and
a dummy buffer supplied by the supply voltage and coupled with an output of the first inverter in parallel with the second inverter,
such that the respective one of the M delayed clock signals is generated at the output of the second inverter responsive to a signal received at an input of the first inverter.

11. The system of claim 1, wherein:
the digital signal encodes the instantaneous phase as a set of K bits, K being a positive integer; and
the FDC delay line comprises:
a first multiplexer comprising:
first M selectable inputs, a first of the first M selectable inputs to receive the first divided clock signal, and the second through Mth first selectable inputs to receive first through (M–1)th of the M delayed clock signals, respectively; and first Q selector bits, each to receive a respective one of a designated Q of the K bits, Q being a positive integer, wherein the first multiplexer selects and outputs the first delayed clock signal from among the first M selectable inputs based on digital states of the designated Q of the K bits; and a second multiplexer comprising:
second M selectable inputs, the first through Mth second selectable inputs to receive first through Mth of the M delayed clock signals, respectively; and second Q selector bits, each to receive a respective one of the designated Q of the K bits, wherein the second multiplexer selects and outputs the second delayed clock signal from among the second M selectable inputs based on digital states of the designated Q of the K bits.

12. The system of claim 1, wherein the DCEI comprises:
a first interpolator stage coupled with the FDC delay line to generate first and second pre-interpolated signals by weighting the average of the third and fourth phases according to the digital signal, such that a fifth phase of the first pre-interpolated signal and a sixth phase of the second pre-interpolated signal are separated by less than 360/(N*M) degrees; and
a second interpolator stage coupled with the first interpolator stage to generate the interpolated clock signal to have the instantaneous phase based on weighting an average of the fifth and sixth phases according to the digital signal.

13. The system of claim 1, wherein the DCEI comprises:
a binary to thermometer decoder that receives an X-bit digital value and asserts between 0 and 2^X output lines based on the received X-bit digital value, the X-bit digital value being encoded by X bits of the digital signal; and
2^DECI unit cells, each comprising a multiplexer having a first respective input coupled with the first delayed clock signal, a second respective input coupled with the second delayed clock signal, a respective selector bit coupled with a respective one of the output lines of the binary to thermometer decoder, and a respective multiplexer output to output a selected one of either the first delayed clock signal or the second delayed clock signal based on whether the respective one of the output lines is asserted,
wherein each of the 2^X DECI unit cells generates a respective one of 2^X DECI unit cell outputs, and the 2^X DECI unit cell outputs are shorted together to generate the interpolated clock signal.

14. The system of claim 13, wherein each of the 2^X DECI unit cells further comprises a resistor-capacitor (RC) filter coupled with the multiplexer output to generate a respective one of 2^X DECI unit cell outputs by filtering the selected one of either the first delayed clock signal or the second delayed clock signal.

15. The system of claim 13, wherein the DCEI further comprises:

a sharpener coupled with the shorted 2^X DECI unit cell outputs to generate the interpolated clock signal by passing the shorted 2^X DECI unit cell outputs through discrete logic.

16. The system of claim 1, wherein:
the digital signal encodes the instantaneous phase as a sequence of k bits, k being a positive integer;
the fractional divider is configured to receive a first portion of the k bits and to select the first and second divided clock signals based on the first portion of the k bits;
the FDC delay line is configured to receive a second portion of the k bits and to select the first and second delayed clock signals based on the second portion of the k bits; and
the DCEI is configured to receive a third portion of the k bits and to weight the average of the third and fourth phases based on the third portion of the k bits.

17. The system of claim 16, wherein:
the sequence of k bits is 12 bits;
the first portion of the k bits is a first 3 of the 12 bits;
the second portion of the k bits is a second 3 of the 12 bits; and
the third portion of the k bits is 6 of the 12 bits.

18. The system of claim 1, wherein:
the local clock signal is received at a reference clock frequency (f); and
each divided clock signal has a frequency of 2f/N.

19. A method for phase modulation and interpolation in a wireless transmitter, the method comprising:
receiving a digital signal that encodes an instantaneous phase for phase-modulating a signal for transmission;
dividing a local clock signal by a fractional divider to generate N divided clock signals, N being an integer greater than 1;
selecting first and second divided clock signals of the N divided clock signals based on the digital signal, the instantaneous phase being greater than or equal to a first phase of the first divided clock signal and less than or equal to a second phase of the second divided clock signal, the first and second phases being separated by 360/N degrees;
generating M delayed clock signals by calibrating M stages of a voltage-controlled delay line based on the first and second divided clock signals, M being an integer greater than 1;
selecting first and second delayed clock signals of the M delayed clock signals based on the digital signal, the instantaneous phase being greater than or equal to a third phase of the first delayed clock signal and less than or equal to a fourth phase of the second delayed clock signal, the third and fourth phases being separated by 360/(N*M) degrees; and
generating an interpolated clock signal to have the instantaneous phase based on weighting an average of the third and fourth phases according to the digital signal.

20. The method of claim 19, further comprising:
modulating a power amplifier output of a voltage-controlled oscillator according to the interpolated clock signal.

* * * * *